(12) United States Patent
Nakamura et al.

(10) Patent No.: US 7,865,070 B2
(45) Date of Patent: Jan. 4, 2011

(54) HEAT TREATING APPARATUS

(75) Inventors: Iwao Nakamura, Toyama (JP); Naoto Nakamura, Toyama (JP); Sadao Nakashima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 397 days.

(21) Appl. No.: 11/578,963

(22) PCT Filed: Mar. 22, 2005

(86) PCT No.: PCT/JP2005/005101

§ 371 (c)(1),
(2), (4) Date: Aug. 2, 2007

(87) PCT Pub. No.: WO2005/104204

PCT Pub. Date: Nov. 3, 2005

(65) Prior Publication Data

US 2008/0267598 A1    Oct. 30, 2008

(30) Foreign Application Priority Data

Apr. 21, 2004    (JP) .............................. 2004-125132

(51) Int. Cl.
*A21B 2/00* (2006.01)
(52) U.S. Cl. ........................ 392/416; 392/418; 392/391
(58) Field of Classification Search ................ 392/416, 392/418, 391
See application file for complete search history.

(56) References Cited

FOREIGN PATENT DOCUMENTS

| JP | 08-070034 | 3/1996 |
|----|-----------|--------|
| JP | 10-340896 | 12/1998 |
| JP | 2002-124519 | 4/2002 |
| JP | 2003-289027 | 10/2003 |

OTHER PUBLICATIONS

Iwao Nakamura et al.: "Development of Ultrahigh Temperature Anneal Technology", Hitachi Kokusai Electric Technical Journal, 2003, No. 4, Mar. 2004 with English translation (37 pages).

*Primary Examiner*—Thor S Campbell
(74) *Attorney, Agent, or Firm*—Kratz, Quintos & Hanson, LLP

(57) ABSTRACT

To prevent both slips caused by damage from projections, and slips caused by adhesive force occurring due to excessive smoothing.

The heat treating apparatus includes a processing chamber for heat treating wafers and a boat for supporting the wafers in the processing chamber. The boat further includes a wafer holder in contact with the wafer and a main body for supporting the wafer holder. The wafer holder diameter is 63 to 73 percent of the wafer diameter, and the surface roughness Ra of the portion of the wafer holder in contact with the wafer is set from 1 μm to 1,000 μm. The wafer can be supported so that the amount of wafer displacement is minimal and both slips due to damage from projections on the wafer holder surface, and slips due to the adhesive force occurring because of excessive smoothing can be prevented in that state.

24 Claims, 16 Drawing Sheets

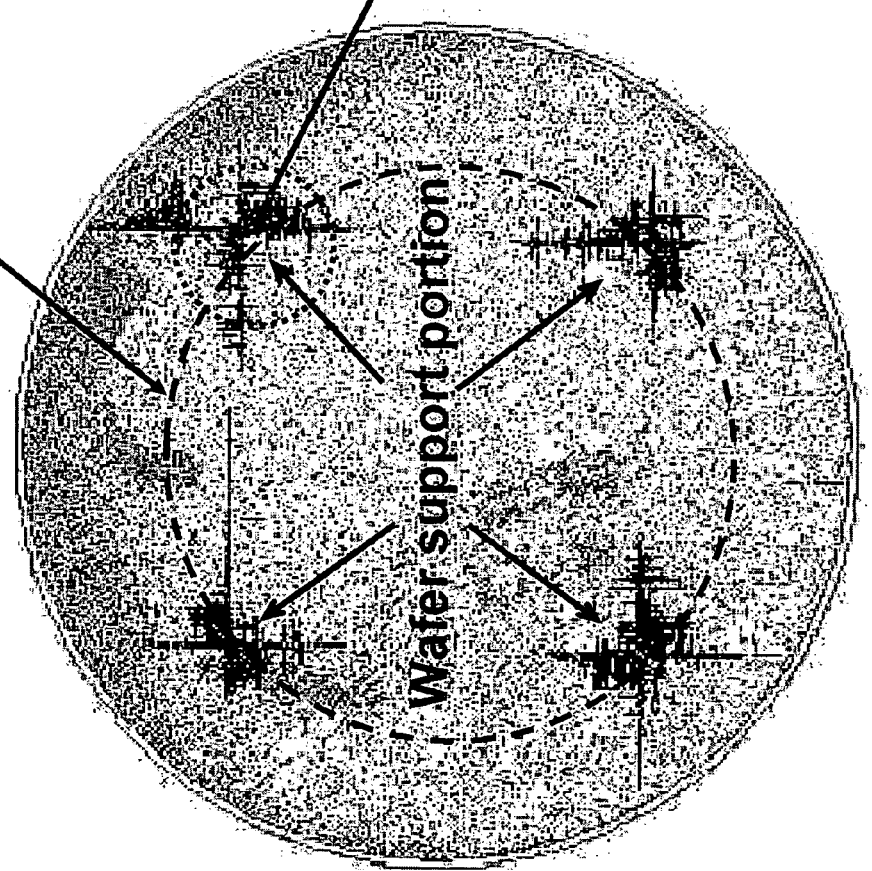
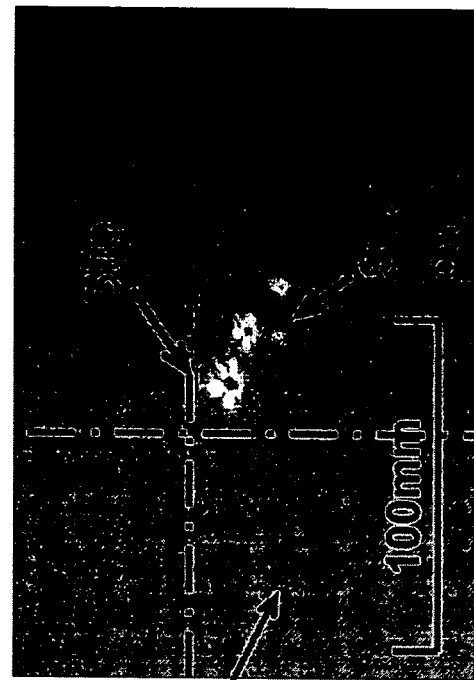
FIG. 11A
FIG. 11B

Plate outer circumference
(Circle with a radius of 90 mm)

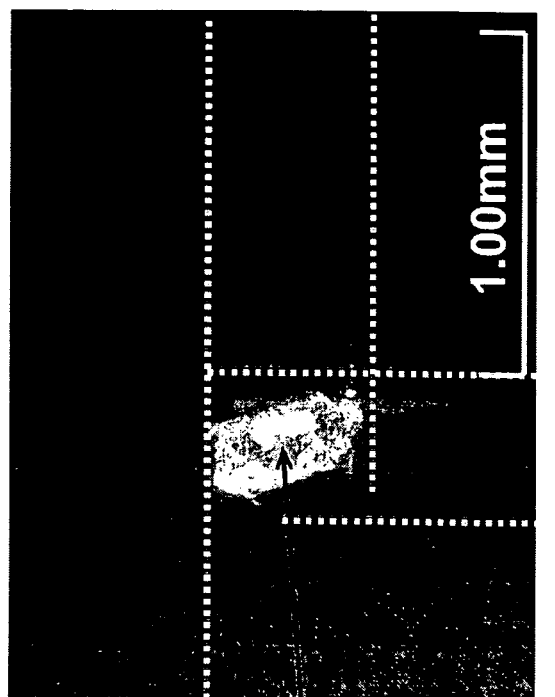
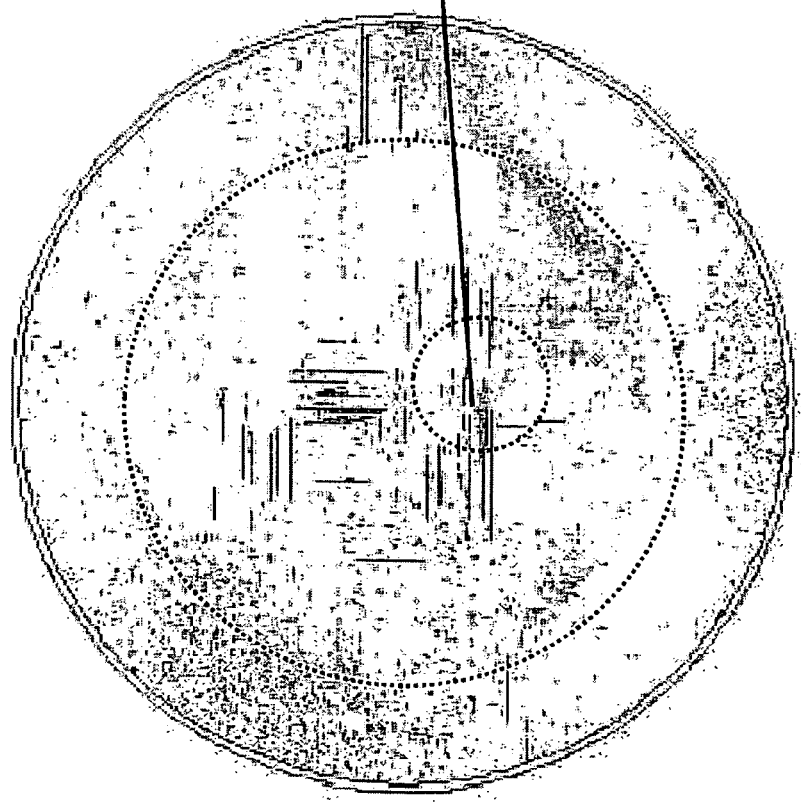
FIG. 15B
FIG. 15A

Small damage on plate edge

Microscope view of rear surface

XRT

HEAT TREATING APPARATUS

TECHNICAL FIELD

The present invention relates to a heat treating apparatus and relates in particular to technology for supporting the substrate for processing, and for example, relates to technology effective in the heat treatment process performed at a comparatively high temperatures to thermally treat the semiconductor wafer (hereafter called, wafer) where the IC is formed in a method for manufacturing semiconductor integrated circuit devices (hereafter called IC).

BACKGROUND ART

A batch type vertical hot-wall heat treating apparatus is widely used in heat treatment processes such as oxidizing, diffusion or annealing process applied to the wafer at comparatively high temperatures in IC manufacturing methods.

This batch type vertical hot-wall heat treating apparatus (hereafter called, heat treating apparatus) includes a process tube installed vertically to form the processing chamber where the wafers are carried in; a heater unit for heating the processing chamber outside the process tube; a boat loaded into and out of the processing chamber, supporting multiple wafers on multiple stage support grooves; and a standby chamber for keeping the boat to be loaded into or out of the processing chamber in a stand-by state.

After the multiple wafers are charged (wafer charging) in the boat in the standby chamber, they are loaded (boat loading) from the standby chamber into the preheated processing chamber. The wafers are then subjected to the desired heat treatment because the processing chamber is heated to the specified heat treating temperature by the heater unit.

The boat in conventional heat treating apparatus of this type, includes a pair of upper and lower edge plates, three piece support members installed for example vertically in between both edge plates, and multiple support grooves formed at equidistant intervals longitudinally on the three piece support members and formed with openings mutually facing each other. The multiple wafers are supported horizontally while arrayed with their centers mutually aligned because they are inserted in the support grooves of the three piece support members.

However, boats with this type of structure possess the following problems. The entire weight of the wafer is supported only by the three support grooves so that when a thermal stress is suddenly applied to the wafer, a crystallizing flaw (slip) then occurs due to its own weight stress and the tensile stress on the contact surface between the wafer and support grooves, and warping occurs on the wafer.

The wafer holder in patent document 1 was disclosed as technology for resolving the problem.

This wafer holder was formed from silicon carbide (SiC) in a circular ring shape for supporting the periphery of the wafer. This wafer holder dispersed and supported the total weight of the wafer along the entire circumference and in this way reduced the gravitational force applied to support points on the wafer contacting the wafer holder and also prevented wafer slip and damage as well as wafer warping.

Patent document 1: Japanese Patent Non-examined Publication No. 7-45691

DISCLOSURE OF INVENTION

Problem to be Solved by the Invention

Damage is generally formed on the rear surface of the wafer from the wafer's own weight due to contact between the wafer and protrusions on the support portion. It is considered that the strain caused by this damage is what makes slipping occur. The "slip suppression" means of the conventional art was to reduce the frictional force acting on the wafer and support portion by forming a smooth surface on the support portion that supports the wafer in order to eliminate protrusions.

However, slips not caused by damage from protrusions were confirmed to occur when the surface on the support portion was smoothed too much. Here, excessive smoothing of the support portion surface induces an adhesive force at the boundary between the wafer and support portion (a bonding force caused by intermolecular force of the molecules on the surface between the two materials) so that slipping occurs when the wafer and support portion stuck to each other are separated (See FIG. 15A and FIG. 15B)

An object of the present invention is to prevent slips caused by an adhesive force from excessive smoothing, as well as prevent slips caused by damage from protrusions.

Means for Solving the Problem

The typical present invention is described next.

(1) A heat treating apparatus comprising: a processing chamber for heat treating a substrate, and a support tool for supporting the substrate in the processing chamber; and the support tool includes a support plate which contacts the substrate, and a main body for supporting the support plate; and characterized in that the diameter of the support plate is 63 to 73 percent of the diameter of the substrate and also in that the surface roughness Ra of at least a portion of the support plate which contacts the substrate is set from 1 μm to 1,000 μm.

(2) A heat treating apparatus according to the above item (1), characterized in that the surface roughness Ra of at least the portion of the support plate which contacts the substrate is set from 1.5 μm to 1,000 μm.

(3) A heat treating apparatus according to the above item (1), characterized in that the surface roughness Ra of at least the portion of the support plate which contacts the substrate is set from 2 μm to 1,000 μm.

(4) A heat treating apparatus according to the above item (1), characterized in that the diameter of the substrate is 300 mm, and the diameter of the support plate is 190 mm to 220 mm.

(5) A heat treating apparatus according to the above item (1), characterized in that the hardness of at least the portion of the support plate which contacts the substrate is the same as or greater than the hardness of the substrate.

(6) A heat treating apparatus according to the above item (1), characterized in that the main body is made from silicon carbide, and the support plate is made from silicon or silicon carbide.

(7) A heat treating apparatus according to the above item (6), characterized in that a layer of silicon oxide, silicon carbide, or silicon nitride is formed on the surface of the support plate.

(8) A heat treating apparatus according to the above item (1), characterized in that the heat treatment is performed at a temperature of 1300° C. or higher.

(9) A heat treating apparatus according to the above item (1), characterized in that at least one through hole is formed in the support plate.

(10) A method for manufacturing a substrate comprising the steps of:

supporting a substrate on a support plate in which the diameter is 63 to 73 percent of the substrate diameter, and the surface roughness Ra of at least the portion which contacts the substrate is 1 μm to 1,000 μm;

loading the substrate supported on the support plate into a processing chamber;

heat treating the substrate supported on the support plate in the processing chamber; and unloading the substrate from the processing chamber after the heat treating.

Effect of the Invention

The invention according to the above item (1) is capable of supporting the substrate so that the amount of the substrate displacement (deflection) is minimal. Moreover, when supporting the substrate in that state, the invention is capable of preventing both slips due to from protrusions on the surface of the support plate, and slips due to the adhesive force occurring due to excessive smoothing of the support plate surface.

The invention according to the above item (2) is capable of reliably preventing both slips when supporting the substrate so that the amount of the substrate deflection is minimal.

The invention according to the above item (3) is capable of preventing both slips to an even greater degree of reliability when supporting the substrate so that the amount of the substrate displacement is minimal.

The invention according to the item above (4) can render the same effects as in the above item (1).

The invention according to the above item (5) can render the same effects as in the above item (1) even when the hardness of at least the portion of the support plate which contacts the substrate is the same hardness or larger than the substrate hardness.

The invention according to the above item (6) can render the same effects as in the above item (1) even when the main body is made from silicon carbide, and the support plate is made from silicon or silicon carbide.

The invention according to the above item (7) can render the same effects as in the above item (1) even when a layer made from silicon oxide, silicon carbide, or silicon nitride is formed on the surface of the support plate.

The invention according to the above item (8) can render the same effects as in the above item (1) even when the heat treating is performed at temperatures of 1300° C. or more.

The invention according to the above item (9) can render the same effects as in the above item (1) even when at least one through hole is formed in the support plate.

The invention according to the above item (10) can render the same effects as in the above item (1).

BRIEF DESCRIPTION OF DRAWINGS

FIG. 5A is an enlarged fragmentary view. FIG. 5B is a view of the overall section.

FIG. 8A is a plane cross sectional view showing the support groove section of the boat. FIG. 8B is a partly abbreviated front view.

FIG. 10A is a drawing showing the wafer holder support model. FIG. 10B is a drawing showing the 4-point support model.

FIG. 11A and FIG. 11B are photographs showing results of the heat treating with the 4-point model at a position of radius of 100 mm. FIG. 11A is an observation photograph of the entire surface of the wafer made by a surface inspection device. FIG. 11B is an optical microscope photograph of the wafer rear surface.

FIG. 12A is an observation photograph of the entire surface of the wafer made by a surface inspection device. FIG. 12B is an optical microscope photograph of the wafer rear surface.

FIG. 15A and FIG. 15B are photographs showing processing results on the wafer whose surface roughness Ra is in the "slip-occurs" region. FIG. 15A is an observation photograph made by a surface inspection device. FIG. 15B is a microscope observation photograph of slips from damage as a start point.

FIG. 16A is an observation photograph made by X-ray topograph. FIG. 16B is a microscope photograph of the small damages on the wafer edge.

BEST MODE FOR CARRYING OUT THE INVENTION

An embodiment of the present invention is described next while referring to the accompanying drawings.

Figure 1:
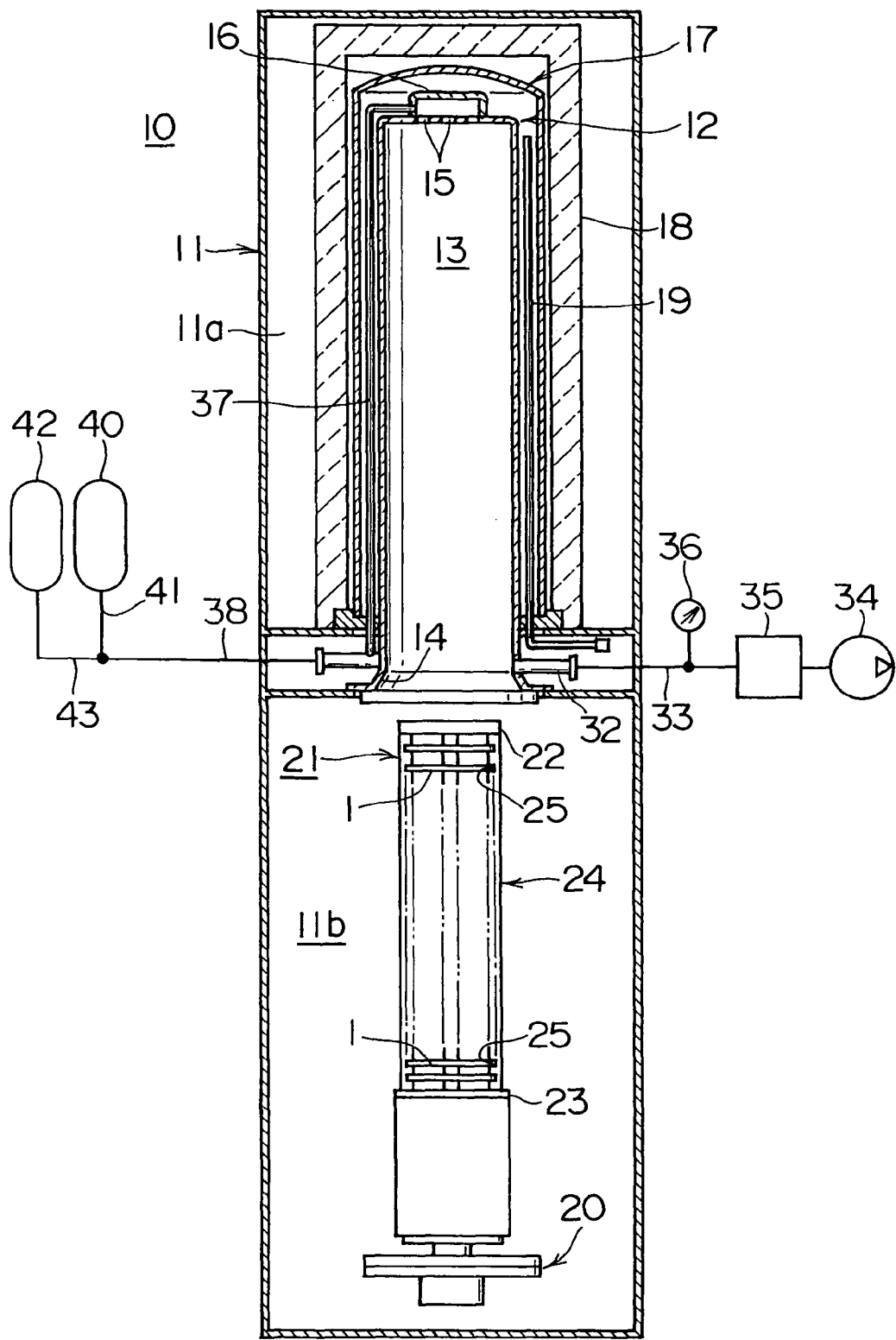
FIG. 1 is a partly abbreviated front cross sectional view showing the oxidizing device of an embodiment of the present invention.
Figure 2:
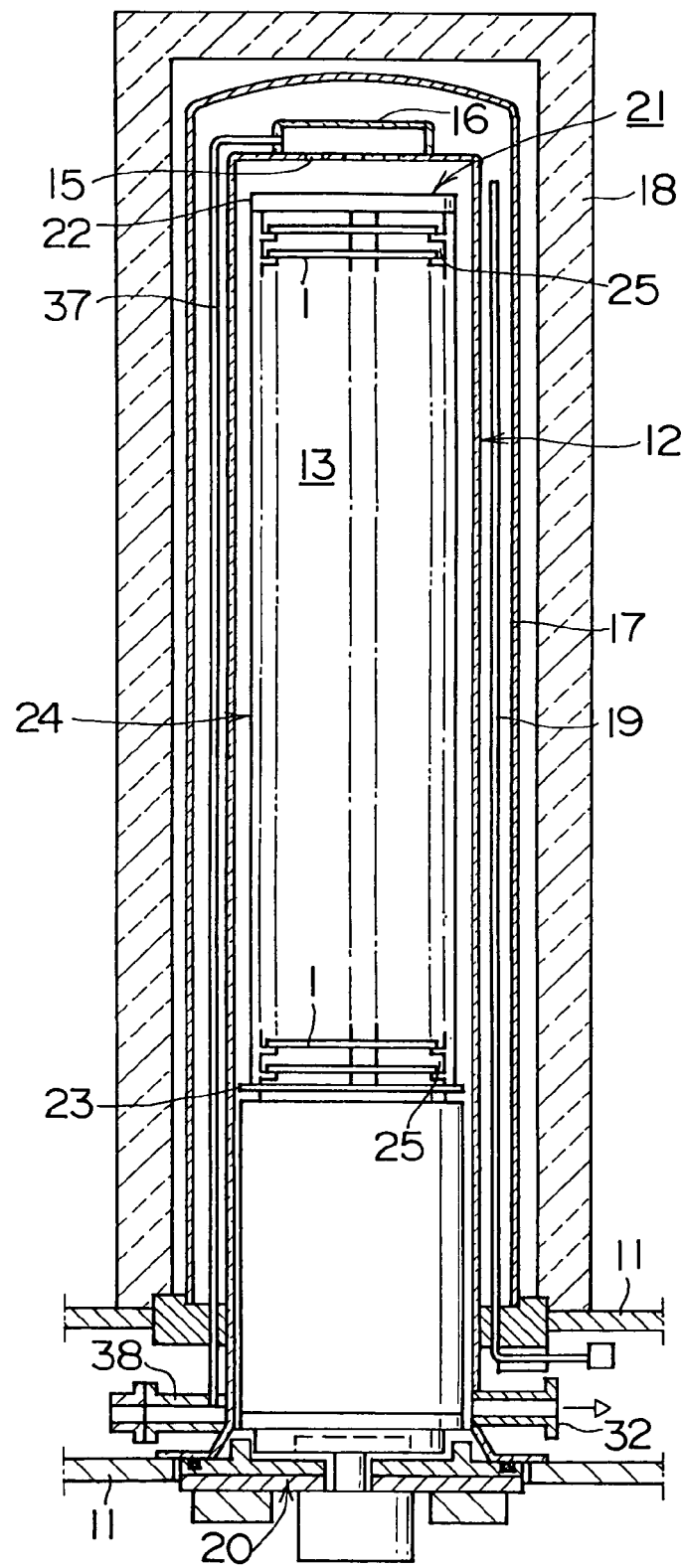
FIG. 2 is a front cross sectional view showing the main essential section.

In the present embodiment, the heat treating apparatus of the present invention is structurally comprised of a heat treating apparatus (batch type vertical hot-wall heat treating apparatus) as shown in FIG. 1 and FIG. 2; and functionally is comprised of a dry oxidizing device (hereafter simply called an oxidizing device) as one type of oxidation film forming apparatus for forming an oxidization film on a wafer.

An oxidizing device 10 contains a process tube (reaction tube) 12. The process tube 12 is made from quartz ($SiO_2$) or silicon carbide (SiC) and formed in an integrated cylindrical shape with the bottom end opened and the top end closed. The process tube 12 is installed vertically so that its centerline is perpendicular and is supported by an installation chamber 11a at the upper portion of a case 11.

The hollow section within the process tube 12 forms a processing chamber 13. The processing chamber 13 is structured to allow load-in of a boat 21 supporting multiple concentrically arrayed wafers 1. The bottom end opening of the process tube 12 forms a furnace opening 14 for loading the boat 21 in and out.

Multiple flow holes 15 are formed in the thickness direction in the sealed wall (hereafter called ceiling wall) on the top end of the process tube 12 to allow the gas to disperse across the entire processing chamber 13. A gas pool 16 is formed on the ceiling wall of the process tube 12 to cover the flow holes 15.

A heat equalizer tube 17 is provided concentrically outside the process tube 12. This heat equalizer tube 17 is also supported by the case 11. The heat equalizer tube 17 is made from silicon carbide (SiC) and formed in an integrated cylindrical shape with the bottom end opened and the top end closed.

A heater unit 18 is installed in a concentric circle so as to enclose the heat equalizer tube 17 on the outer side of the heat equalizer tube 17. The heater unit 18 is also supported by the case 11. A thermocouple 19 is installed facing upward and downward between the process tube 12 and the heat equalizer tube 17. This heater unit 18 is structured to heat the entire interior of the processing chamber 13 to a specified temperature distribution or a unified temperature distribution by control of the controller (not shown in the drawing) based on the temperature detection of the thermocouple 19.

An exhaust pipe 32 at the bottom section on the side wall of the process tube 12 is connected with the processing chamber 13. The exhaust pipe 32 connects to one end of an exhaust line 33. An exhaust apparatus 34 comprised of a blower and vacuum pump, etc. is connected to the other end of the exhaust line 33. A pressure regulator 35 is installed on the way of the exhaust line 33. This pressure regulator 35 controls the pressure of the processing chamber 13 to a specified pressure via a controller (not shown in the drawing) based on detection results from a pressure sensor 36 connected on the way of the exhaust line 33.

A supply pipe 37 is installed on the outer side of the process tube 12. This supply pipe 37 extends upward and downward along a section of the process tube 12 and the top end of this supply pipe 37 connects to the gas pool 16. A process gas supply line 38 connects to the bottom end of the supply pipe 37. An oxygen gas supply line 41 connected to an oxygen ($O_2$) gas source 40; and a nitrogen gas supply line 43 connected to a nitrogen gas ($N_2$) source 42 are respectively connected to this process gas supply line 38.

A seal cap 20 formed in a disk shape roughly equivalent to the outer diameter of the process tube 12 is installed concentrically directly below the process tube 12 in the standby chamber 11b which is the lower chamber of the case 11. The seal cap 20 is structured to be raised and lowered vertically by a boat elevator (not shown in the drawing) comprised by a feed screw mechanism. The boat 21 functioning as a support tool to support the substrate is supported vertically on the seal cap 20.

The boat 21 is made from silicon carbide. The boat 21 is comprised of a pair of end plates 22, 23 at top and bottom, and multiple support members (three pieces in this example) 24 installed perpendicularly between both end plates 22, 23.

Support grooves 25 in numerous steps are formed longitudinally at equal distances facing each other at the same step in the support member 24.

Figure 3:
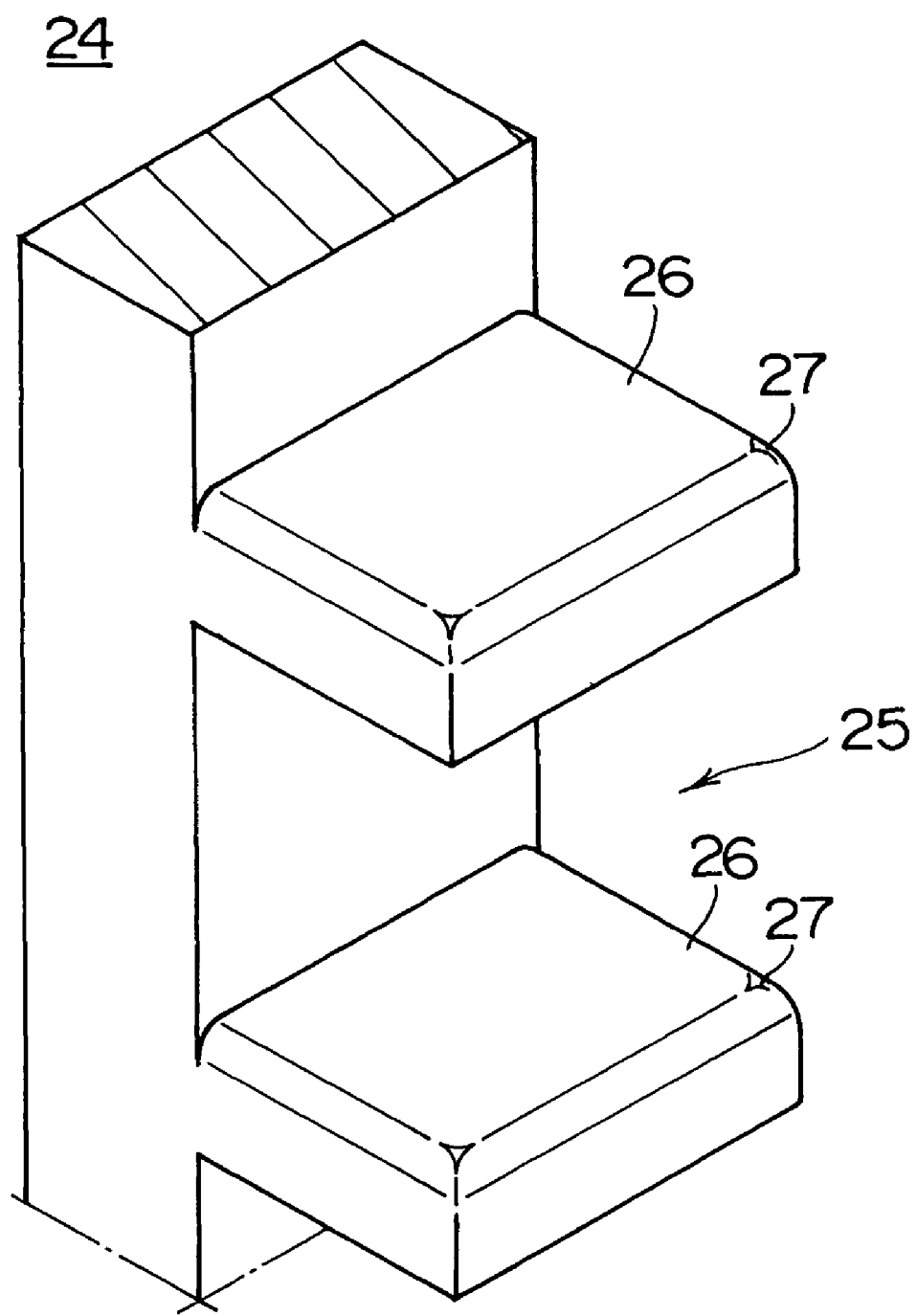
FIG. 3 is a perspective view showing a portion of the support groove of the boat.

An R chamfer section 27 is formed on the outer circumference edge of a support surface 26 formed from the upward facing surface of each support groove 25 as shown in FIG. 3. The radius of curvature of the R chamfer section 27 is set to 1 mm or more.

The surface of the support surface 26 portion which contacts the wafer 1 is set to a surface roughness (Ra) between $10^{-6}$ m (1 μm) and $10^{-3}$ m (1000 μm). The outer circumferential portion of the wafer 1 is inserted and supported on the support grooves 25, 25, 25 on the same stage of the three support members 24, 24, 24. The support surface 26 supporting the three points on the periphery of that lower surface is set to a surface roughness (Ra) from $10^{-6}$ m to $10^{-3}$ m. The multiple wafers 1 are arrayed horizontally and mutually along the center of the boat 21 while respectively supported on these support grooves 25.

The methods for setting the surface configuration and roughness of the support portion which is the characteristic of the present invention for supporting the wafer 1 while in contact with the lower surface of the wafer 1 are described next.

Damage from the wafer's own weight is usually formed on the wafer due to contact of the wafer and protrusions on the support portion. It is considered that the strain caused by this damage causes slips to occur. Therefore, damage caused by the wafer's own weight must be limited in order to prevent slips from occurring (hereafter called slip-free). Moreover, the force created by the protrusion must be reduced in order to limit damage due to the wafer's own weight.

The friction force Ff acting on the support portion and wafer is generally expressed by multiplying the perpendicular load L from the wafer's own weight by the friction coefficient μ as shown in the following formula (1) (Coulomb's law).

$$Ff=\mu \times L \tag{1}$$

One method often used to achieve a slip-free is to lower the friction coefficient μ between the wafer and the support portion by making the surface of the portion which supports the wafer as smooth as possible.

However, the friction coefficient μ is basically a fixed value. Smoothing the surface of the support portion is actually to reduce the frictional force acting on each support point by increasing the number of tiny support points to divide the perpendicular load.

Figure 4:
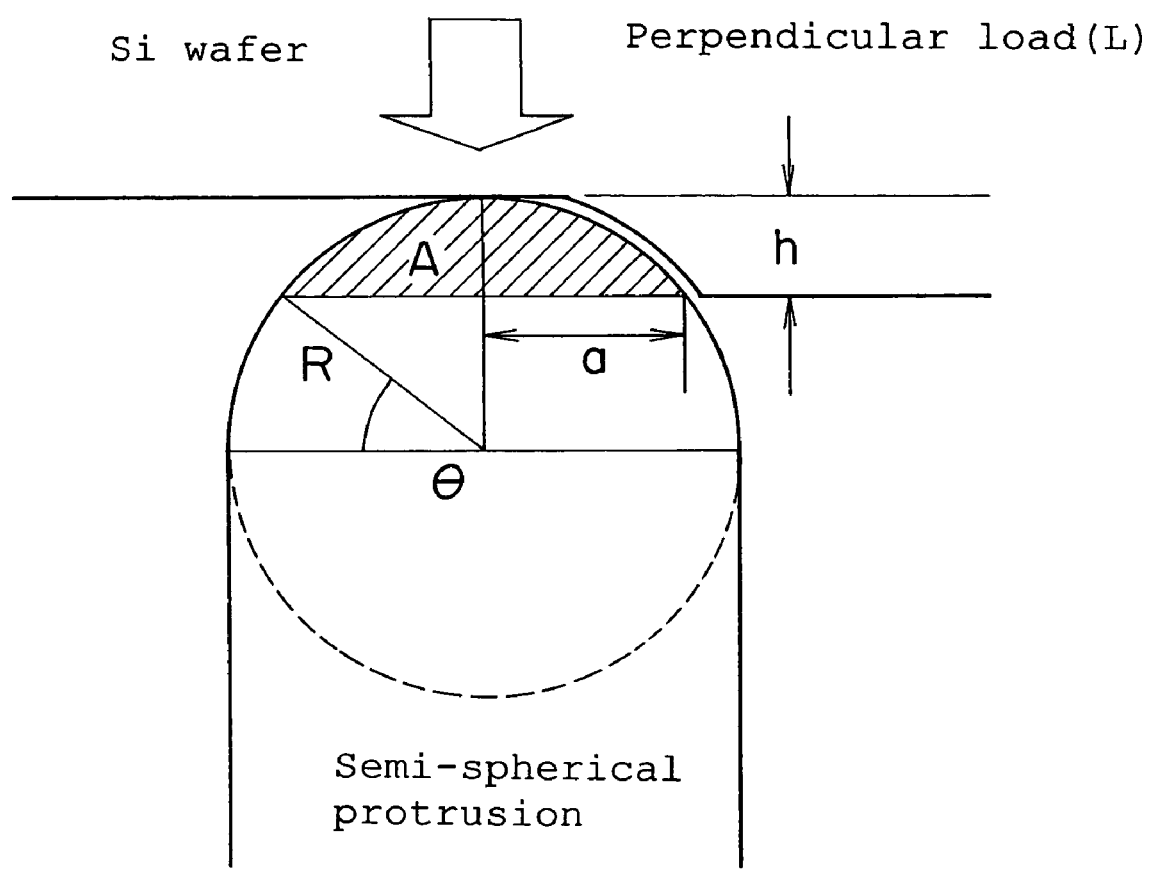
FIG. 4 is a diagram view showing a contact model between the flat surface and semi-spherical protrusion.

Contact between the wafer and the support portion is here assumed as contact between a semi-spherical protrusion and a level surface (wafer) as shown in FIG. 4.

In FIG. 4, R is the radius of curvature of the semi-spherical protrusion, a is the radius of the damage formed on the surface by the semi-spherical protrusion, h is the depth of that same damage, and A is the surface area of that same damage. The surface area A of the damage is called the true contact surface area. When two materials make contact at a perpendicular load L, the soft material (material with small yield stress) deforms plastically, and the surface area that deforms until the stress on the contact surface becomes equal to the yield stress (σ) is the true contact surface area A. This true contact surface area A is expressed by the following formula (2). The value for the true contact surface area A is a characteristic value for two materials in contact with each other and is not dependent on the state of the surface.

$$A[m^2]=L[N]/\sigma[Pa] \tag{2}$$

Figure 5A:
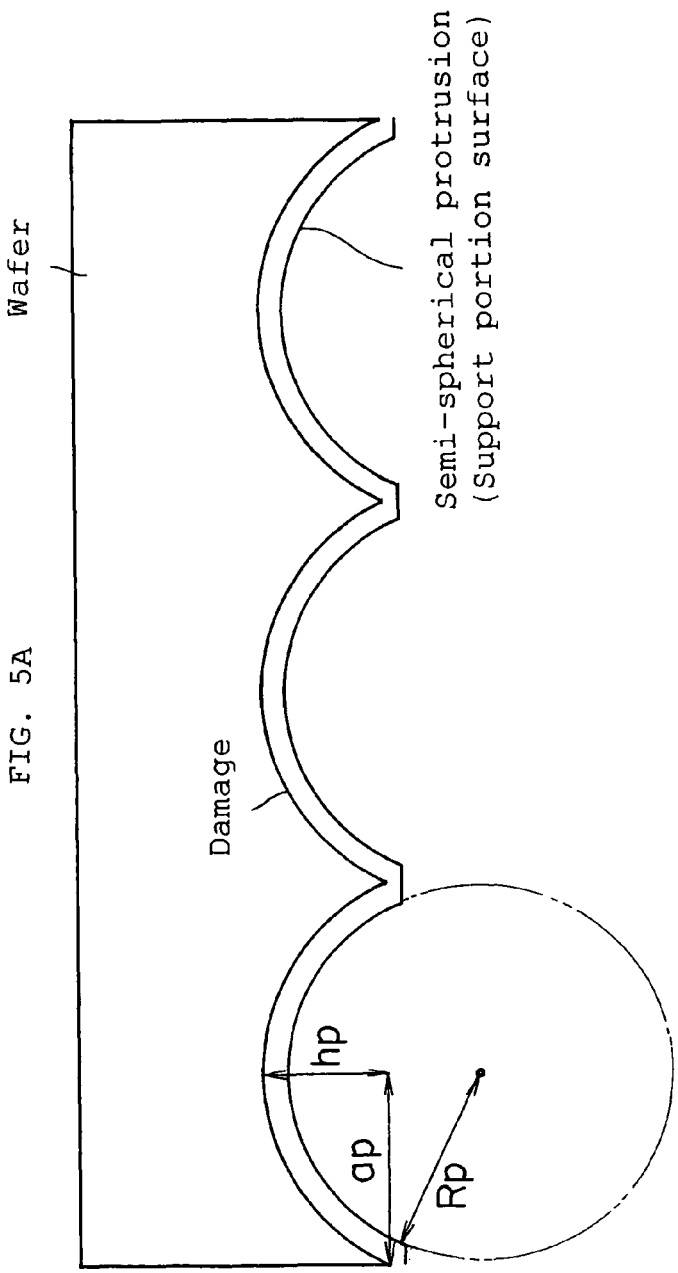
FIG. 5A and FIG. 5B are drawings showing a support model of a piece of continuous semi-spherical protrusions.
Figure 5B:
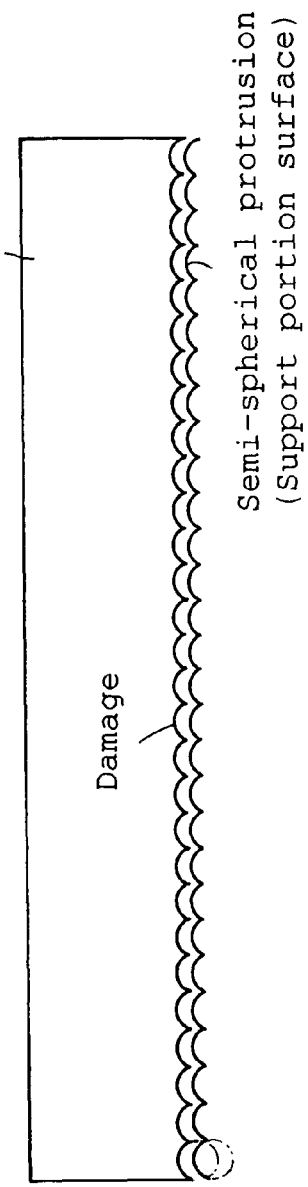

The following description here assumes the case where a piece with continuous multiple semicircular protrusions is supporting the wafer as shown in FIG. 5A and FIG. 5B.

The perpendicular load made up of "wafer's own weight L/number P of support points" is applied to each of the multiple semi-spherical protrusions. In the symbols used from here onward, a "p" attached to a character signifies "per each support point".

A large surface roughness (Ra) is a state as shown in FIG. 5A, where the radius of curvature (Rp) of the semi-spherical protrusions is large, and there are few support points. A small surface roughness (Ra) is a state as shown in FIG. 5B, where the radius of curvature (Rp) of the semi-spherical protrusions is small, and there are many support points.

When the radius of curvature of the semi-spherical protrusions is large, then there is a large frictional force acting on each support point so that damage formed on the wafer is deep and becomes large. Therefore, slips easily tend to occur from this damage as the start point. Conversely, when the radius of curvature of the semi-spherical protrusions is small, the perpendicular load acting on each support point is reduced, which inhibits the forming of damage that becomes the start point for slipping.

Figure 6:
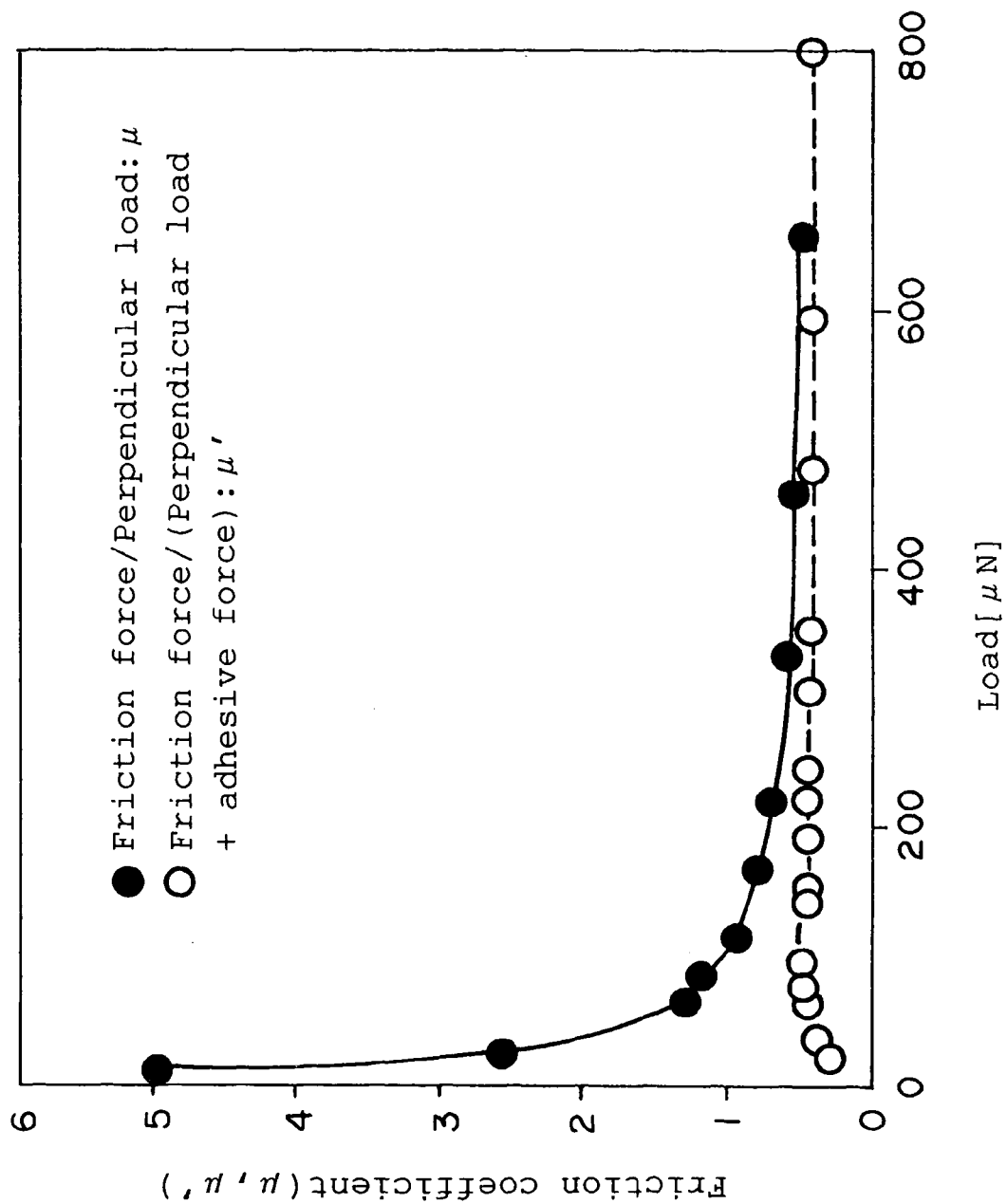
FIG. 6 is a graph showing the interrelation between the perpendicular load and adhesive force and the friction coefficient.

However, the friction coefficient μ is extremely large under conditions where the perpendicular load is extremely small as shown by the solid line curve in the graph in FIG. 6 that shows the interrelation between the perpendicular load and the adhesive force and the friction coefficient. This result occurs because friction force Ff is actually expressed as a size just as shown in the following formula (3), by multiplying a fixed apparent friction coefficient (μ') at the boundary surface by the sum of the perpendicular load L and the "adhesive force Fa". The source for FIG. 6 and the observations is as follows.

Yasuhisa Ando, "Micromachine and Tribology", Surface Science, 1998, Vol. No. 19, Issue No. 6, p. 385-391

Here, the "adhesive force F" is the binding force from the intermolecular force (Van der Waals force) of the molecules on the surface between two materials.

$$Ff=\mu'(L+Fa) \quad (3)$$

Here, the adhesive force Fa is expressed by the following formula (4) from the JKR theory assuming use of the contact model shown in FIG. 4.

$$Fa=3/2 \times \gamma \pi R \quad (4)$$

In formula (4), γ is the characteristic surface energy of the material. In the case of Si (100), the surface energy is 2.13 [N/m]. One can see from formula (4) that the adhesive force Fa is proportional to the radius of curvature R of the semi-spherical protrusion.

The friction coefficient μ is derived via formula (1) and formula (3) as expressed in the following formula (5).

$$\mu=\mu'(L+Fa)/L \quad (5)$$

$$\text{However, } Fa=p \times Fap \quad (6)$$

Figure 7:
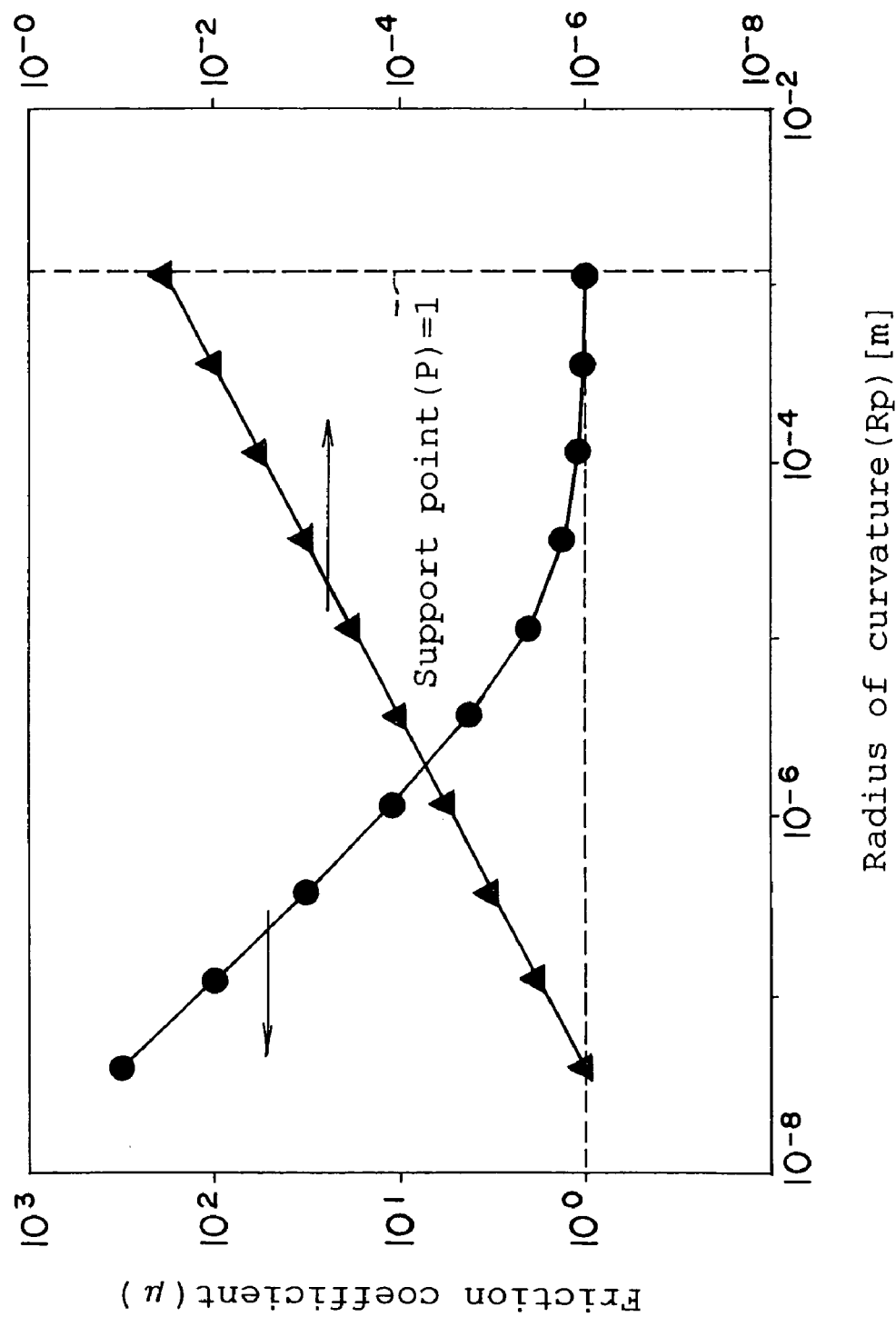
FIG. 7 is a graph showing the interrelation between the radius of curvature Rp and perpendicular load acting on each unit of surface area per the support points and the friction coefficient μ.

FIG. 7 is a graph showing the relation between the radius of curvature Rp, and the perpendicular load acting per unit of surface area on each support point and the friction coefficient μ. In FIG. 7, the true contact surface area A is approximately calculated for a heat treating process of "1350° C." from the previously known silicon yield stress value and silicon yield stress value obtained in a heat treating process implemented at "1200° C." in a prior evaluation, and applied to formula (5). The apparent friction coefficient μ' at this time is set as a fixed value "1".

In areas where the radius of curvature of the semicircular protrusions is small (smooth flat surface), the friction coefficient μ increases sharply due to the dominant adhesive force Fa, and one can see that a large friction force Ff is acting between the wafer and support portion. Conversely, the load acting per unit of surface area on each support point increases along with the radius of curvature (Rp).

The formation of damage due to protrusions must be suppressed (The load acting on each protrusion must be reduced) and friction force Ff acting between the wafer and support portion must be reduced in order to prevent the occurrence of slips. To achieve these goals, in FIG. 7, a surface state with the radius of curvature Rp balanced in the following two areas must be achieved.

1) Area with small friction coefficient μ
2) Area with small perpendicular load per each support point In FIG. 7 for example, when the continuous protrusions have a radius of curvature of $10^{-6}$ m or more, then the friction coefficient (μ) may be as large as "10" and the perpendicular load is a small $10^{-4}$ [N/point/m²] so that slips caused from damage by protrusions are not likely to occur.

In case of continuous protrusions smaller than this, the perpendicular load becomes even smaller but the friction coefficient (μ) that affects the adhesive force increases so that damage is formed due to the adhesive force in the portion where the protrusions and wafer make contact and slips occur due to this factor.

Conversely, when the "large" continuous protrusions have a radius of curvature of $10^{-3}$ m or more, then the friction coefficient is sufficiently small but the perpendicular load per each support point becomes large, and slips caused from damage by protrusions are prone to occur.

In other words, an ideal wafer support surface is a surface with continuous protrusions whose radius of curvature is between approximately $10^{-6}$ m and $10^{-3}$ m. The surface roughness (Ra) calculated at this time is a figure between approximately $10^{-6}$ m and $10^{-3}$ m.

Deriving the surface roughness Ra utilized in the actual evaluation and the friction coefficient μ shown in FIG. 7, from the semi-spherical protrusions shown in FIG. 4 is described here.

Calculating each parameter for each support points is described first. The true contact surface area A is the surface area of the section cut out from the semicircular protrusion with the radius of curvature R by the radius "a" (radius of damage). Setting the angle as θ at the height h of the cut out section yields the following formula.

$$A=2\pi R^2(1-\sin\theta) \quad (7)$$

$$a=R\cos\theta \quad (8)$$

$$h=R(1-\sin\theta) \quad (9)$$

Here, by setting the damage depth h divided by the radius a of the damage as the cut-in amount Dp, we derive the remaining elements as follows.

$$Dp=h/a \quad (10)$$

$$a=[A/\{\pi \times (1+Dp^2)\}]^{1/2} \quad (11)$$

$$h=a \times Dp=Dp \times [A/\{\pi(1+Dp^2)\}]^{1/2} \quad (12)$$

$$R=\{A \times (1+Dp^2)/(4\pi Dp^2)\}^{1/2} \quad (13)$$

When supporting at support points of number P, the true contact surface area A and the perpendicular load are divided by the number P of support points.

$$Ap = A/P \quad (14)$$

$$Lp = L/P \quad (15)$$

Applying this to the formulas (3), (4), (11) and (13) yields:

$$Ffp = \mu'(Lp + Fap) \quad (16)$$

$$Fap = 3/2 \times \gamma \pi Rp \quad (17)$$

$$ap = [Ap/\{\pi \times (1 + Dp^2)\}]^{1/2} \quad (18)$$

$$hp = a \times Dp = Dp \times [Ap/\{\pi \times (1 + Dp^2)\}]^{1/2} \quad (19)$$

$$Rp = \{Ap \times (1 + Dp^2)/(4\pi Dp^2)\}^{1/2} \quad (20)$$

that form the values for each support point.

The process for forming the oxidation film on the wafer using the previously described oxidizing device in the IC manufacturing method is described next.

In the process for forming the oxidation film as shown in FIG. 1, the boat 21 supporting multiple arrayed wafers 1 is loaded onto the seal cap 20 with the wafer 1 group arrayed along a vertical direction. The boat 21 is raised upward by a boat elevator and loaded from the furnace opening 14 of the process tube 12 into the processing chamber 13 (boat loading), and is positioned in the processing chamber 13 while still supported on the seal cap 20. In this state, the seal cap 20 joins via a seal ring to seal the processing chamber 13 is in an air-tight state.

In the state where the processing chamber 13 is sealed air-tight, the interior of the processing chamber 13 is evacuated via the exhaust line 33, heated to a specified temperature by the heater unit 18, and when the temperature of the wafers stabilizes after reaching the processing temperature (for example 1000 to 1200° C.), then oxygen gas and nitrogen gas of specified flow quantities are respectively supplied to the process gas supply line 38 via the oxygen gas supply line 41 and the nitrogen gas supply line 43.

The oxygen gas and nitrogen gas supplied to the process gas supply line 38, is fed to the supply pipe 37 from this process gas supply line 38, and supplied via the supply pipe 37 to the gas pool 16 of the process tube 12. The process gas supplied to the gas pool 16 is uniformly dispersed across the entire interior of the processing chamber 13 through the flow holes 15.

The process gas dispersed uniformly in the processing chamber 13 flows downward while making respective uniform contact with the multiple wafers 1 supported in the boat 21, and is exhausted from the exhaust pipe 32 by the exhaust force of the exhaust line 33 to outside the processing chamber 13. An oxidation film is then formed on the surface of the wafers 1 by an oxidation reaction due to the process gas contacting the surface of the wafers 1.

The supply of oxygen gas and nitrogen gas to the processing chamber 13 is stopped after the preset processing time has elapsed. After then purging the sections such as the processing chamber 13 and the gas pool 16 with nitrogen gas, the boat elevator lowers the seal cap 20, and the boat 21 is loaded out from the processing chamber 13 to the standby chamber 11b (boat unloading).

After boat unloading is completed, the wafer discharging step is executed in order to extract the now processed wafers 1 from the boat 21.

The oxidizing device then batch processes the wafers by repeating the above described actions.

In this oxidation film forming process, damage is usually formed on the wafer rear surface due to the wafer's own weight from contact between the wafer and protrusions of the support portion, and the strain caused by this damage is thought to cause slipping. The technology of prior art therefore attempted to reduce the friction force acting between the wafer and the support portion, by smoothing the wafer supporting surface and eliminating protrusions.

However, slips that were not caused by damage from protrusions were sometimes confirmed to occur when the surface on the support portion was smoothed too much. Here, excessive smoothing of the support portion surface induces an adhesive force at the boundary between the wafer and support portion so that slipping occurred when the wafer and support portion stuck to each other were separated.

The present embodiment is capable of preventing slips due to damage from protrusions dealt with as problems in the prior art and slips due to the adhesive force occurring due to excessive smoothing by setting the support portion namely, the support surface 26 of the support groove 25 of the boat 21 to a surface roughness (Ra) between $10^{-6}$ m and $10^{-3}$ m.

The above described embodiment yields the following effects.

1) The production yield of the oxidizing device and therefore the entire IC manufacturing method can be improved since occurrence of slips can be prevented in the wafer portion where the wafer and the support portion make contact during the oxidation process by the oxidizing device by setting the surface roughness (Ra) of the support portion which contacts and supports the wafer between $10^{-6}$ m and $10^{-3}$ m.

2) The adhesive force in the contact portion of the silicon wafer and the support portion can be set to a specific value by making the support portion from silicon carbide so that slips can be prevented from occurring in the portion of the wafer which contacts the support portion during the oxidation process by the oxidizing device by setting the degree of cut-in to lower than a specified value, and setting the surface roughness (Ra) of the support portion between $10^{-6}$ m and $10^{-3}$ m.

Figure 8A:
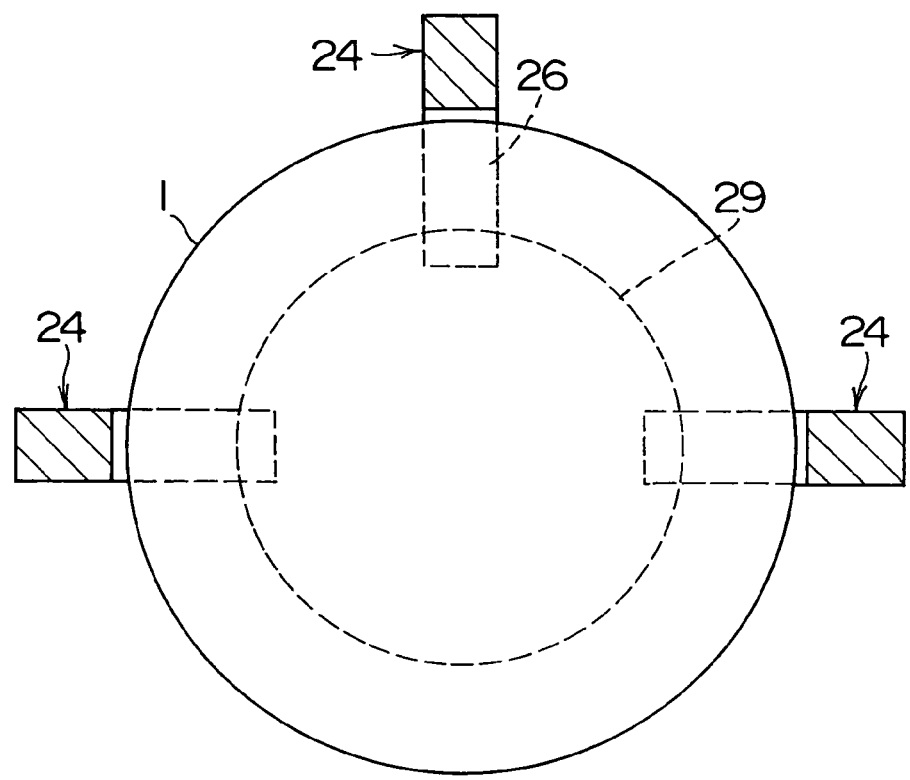
FIG. 8A and FIG. 8B are drawings showing the oxidizing device of another embodiment of the present invention.
Figure 8B:
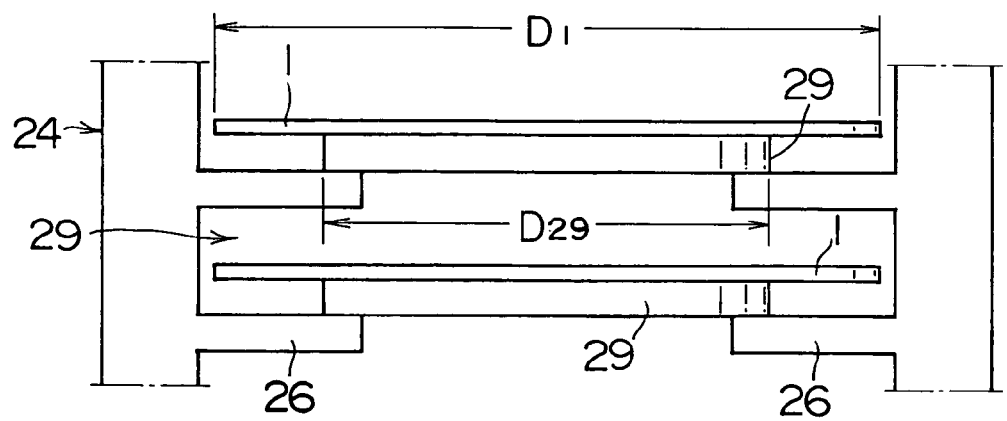

FIG. 8A and FIG. 8B show the oxidizing device of another embodiment of the present invention. FIG. 8A is a plane cross sectional view showing the support groove section of the boat. FIG. 8b is a partially omitted front view.

The point where this embodiment differs from the previous embodiment is that the support tool includes a wafer holder 29 functioning as the support plate which contacts the wafer, and a main body for supporting the wafer holder 29 as the support plate; and that the wafer 1 is supported by the wafer holder 29.

The wafer holder 29 of this embodiment is comprised of a circular plate made of silicon, and has a silicon carbide film or a silicon nitride film whose hardness is greater than silicon on the surface of the plate.

Silicon oxide film with a hardness lower than the silicon may be formed on the surface of the circular plate made of silicon in the wafer holder 29.

The wafer holder 29 may also be made from silicon carbide.

The diameter $D_{29}$ of the wafer holder 29 is set from approximately ⅔rds of the diameter $D_1$ of the wafer 1 to less than the diameter $D_1$ of the wafer 1, and preferably is set from 63 to 73 percent of the diameter $D_1$ of the wafer 1, and more preferably is set from 65 to 75 percent of the diameter $D_1$ of the wafer 1.

For example, when the wafer diameter $D_1$ is 300 mm, then the diameter $D_{29}$ of the wafer holder 29 is set from approximately 200 mm to 300 mm, and preferably from 190 to 220 mm, and more preferably from 195 to 210 mm.

The surface roughness (Ra) of the surface contacting the wafer 1 of the wafer holder 29 is set from between $10^{-6}$ m (1 μm) and $10^{-3}$ m (1000 μm), and preferably is set from 1.5 μm to 1000 μm, and more preferably is set from 2 μm to 1000 μm.

The method for setting the diameter of the wafer holder 29 which is the characteristic of the present embodiment is described next.

Figure 9:
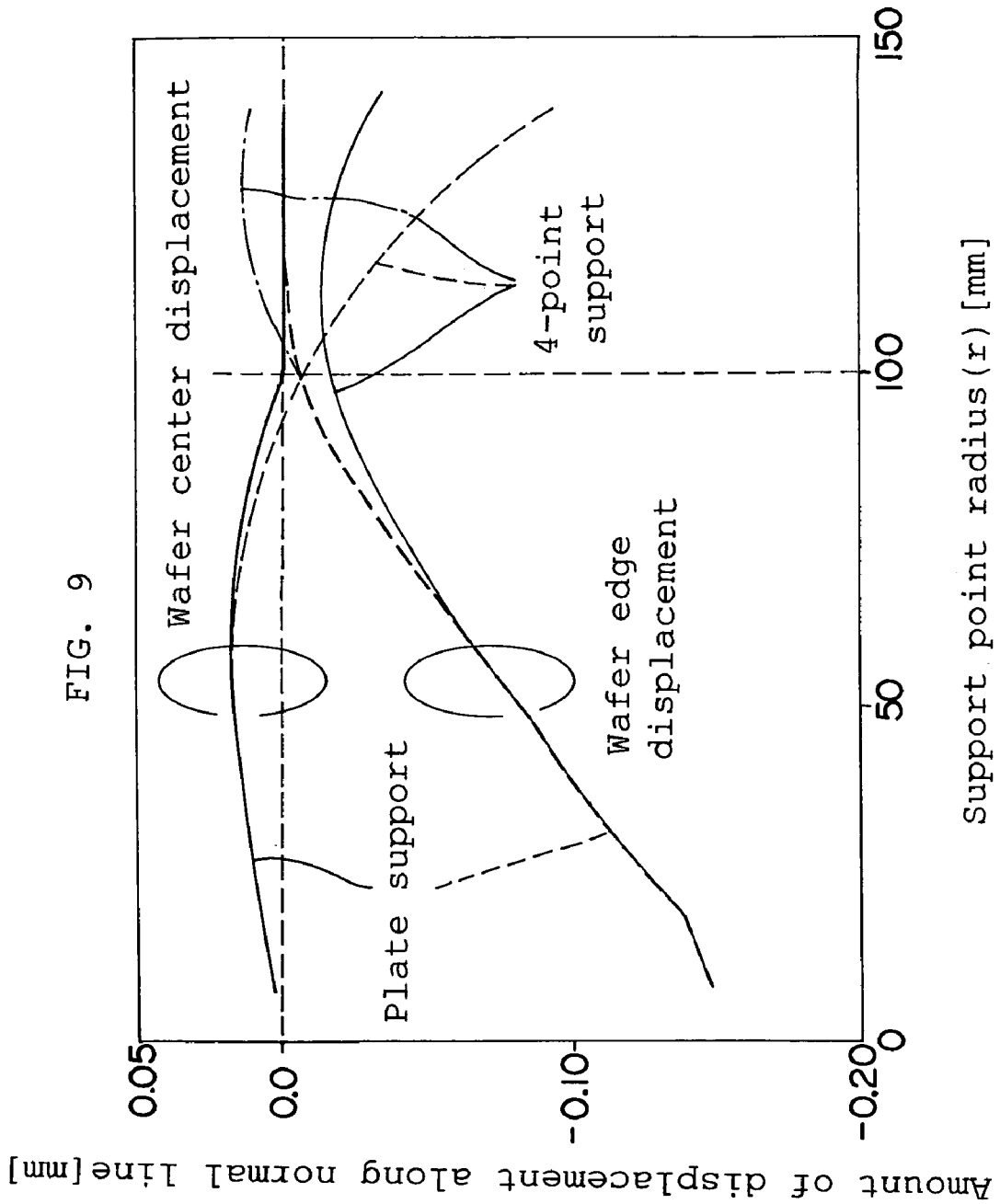
FIG. 9 is a graph showing analysis results for the interrelation of the deflection amount at the center, the wafer edge and support position on the wafer holder support model and the 4-point support model.

FIG. 9 is a graph showing analysis results relating to the displacement at the center, and the support position and wafer end in the model where the wafer is supported by the wafer holder (hereafter called wafer holder support model), and the model where the wafer is supported at four points (hereafter called 4-point support model).

In FIG. 9, the solid line curve indicates the wafer holder support model, and the broken line curve indicates the 4-point support model.

Figure 10B:
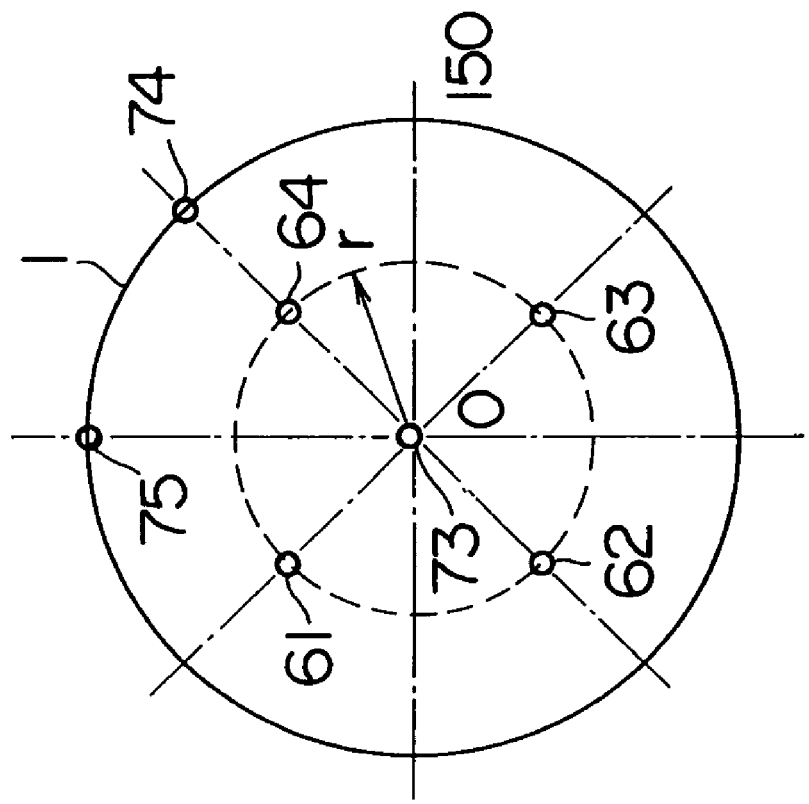
FIG. 10A and FIG. 10B are diagram views showing the model used in the analysis.
Figure 10A:
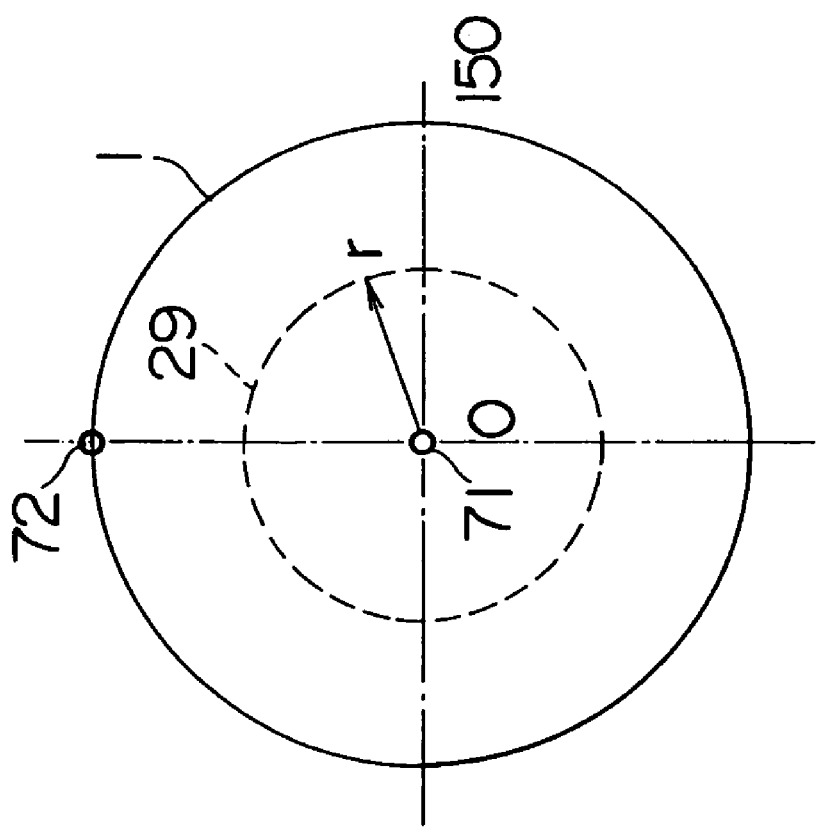

FIG. 10A and FIG. 10B are diagrams showing the model utilized in the analysis. FIG. 10A is for the wafer holder support model and FIG. 10B is for the 4-point support model.

In FIG. 10A and FIG. 10B, the numeral 1 denotes the wafer, 29 denotes the wafer holder, and 61, 62, 63, 64 denote the four support points. These four support points are respectively disposed at a mutual 90 degrees phase differential on a radius r identical to the radius r of the wafer holder 29. The numerals 71 through 75 are measurement points. A first measurement point 71 is positioned at the center ○ of the wafer holder support model; and a second measurement point 72 is positioned on the edge of the wafer 1 of the wafer holder support model. A third measurement point 73 is positioned at the center ○ of the 4-point support model, a fourth measurement point 74 is positioned on the edge of the wafer 1 along a line extending from the center ○ of the wafer through the fourth support point 64. A fifth measurement point 75 is positioned on the edge of the wafer 1 along a straight line extending from the center ○ of the wafer through the center point between the adjoining first support point 61 and fourth support point 64.

From FIG. 9, it can be seen that the minimum displacement can be attained by setting the support positions to a position of radius of 95 mm to 110 mm from the center of the wafer, and preferably 97.5 mm to 105 mm, or more preferably approximately a 100 mm position, regardless of whether using the wafer holder support model or 4-point support model.

However, in the 4-point support model the displacement is 0 mm at the fourth measurement point 74 positioned along a line extending from the wafer center through the support point. However, the fifth measurement point 75 positioned at the center point between adjoining support points, sags slightly downward (−0.016 mm). More precisely, in the 4-point support model there is a difference in displacement in a concentric state due to the support point positions (angle or phase differential).

In other words, as shown in FIG. 8A and FIG. 8B, there is no problem due to displacement from the weight of the wafer 1 itself, if the wafer 1 whose radius is 150 mm; or in other words whose diameter of 300 mm, is supported by the wafer holder 29 whose radius is 95 mm, preferably 97.5 mm or more preferably 100 mm; or in other words whose diameter of 190 mm, or preferably 195 mm, or still more preferably 200 mm or more.

The diameter of the wafer holder 29 in other words may be set to 63 percent or more of the wafer 1 diameter, or preferably 65 percent, or still more preferably ⅔rds or more of the wafer 1 diameter.

However, in the present embodiment, in view of the need for a space to insert the tweezers of the wafer transfer equipment for giving and receiving the wafers 1 from the wafer holder 29, the diameter of the wafer holder 29 is set from approximately ⅔rds of the wafer 1 diameter to less than the wafer 1 diameter, and preferably is set to 60 percent or more and 73 percent or less of the wafer 1 diameter, and still more preferably is set to 63 percent or more and 73 percent or less of the wafer 1 diameter.

Heat treating was performed at 1350° C. to evaluate the surface roughness Ra as a microscopic surface shape, understanding the wafer holder support model and 4-point support model as a macroscopic support shape.

FIG. 11A and FIG. 11B show results of the heat treating in the 4-point support model at a position of radius of 100 mm. FIG. 11A is an observation photograph of the entire surface of the wafer by a surface inspection device. FIG. 11B is an optical microscope photograph of the wafer rear surface.

The chain line in FIG. 11A and FIG. 11B is a circle with a radius of 100 mm. The wafer is supported at the intersection with the diagonal line on the circumference.

Results from the surface inspection device confirmed the presence of slips (cross marks shown by arrows in the figure) at all four support point locations.

As shown in the microscope photograph of the wafer rear surface in FIG. 11B, the stress caused by deformation due to the wafer's own weight and heat expansion during rises and falls in temperature, concentrates on the wafer support points and damage is formed. It is thought that damage serves as start points to cause slips.

Figure 12B:
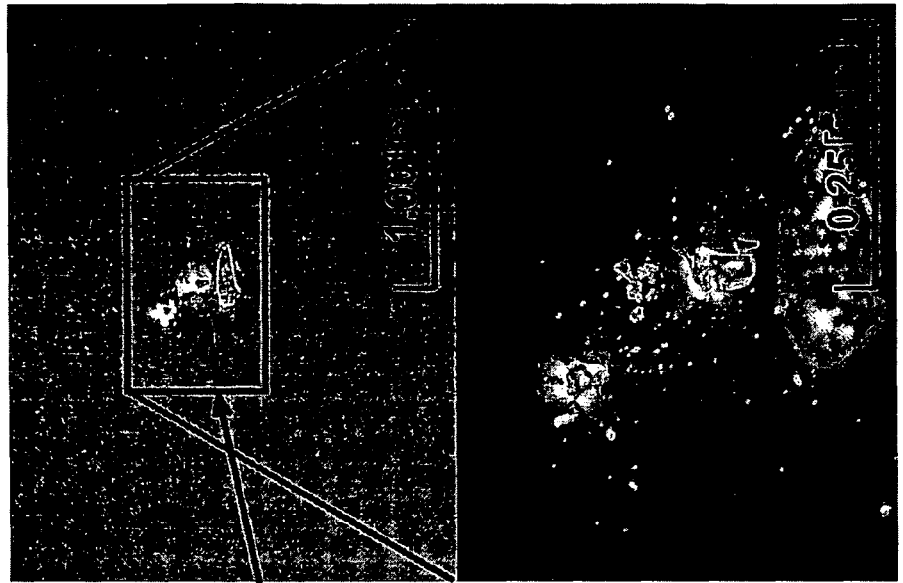
FIG. 12A and FIG. 12B are photographs showing results from heat treating with the wafer holder support model with a diameter of 180 mm.
Figure 12A:
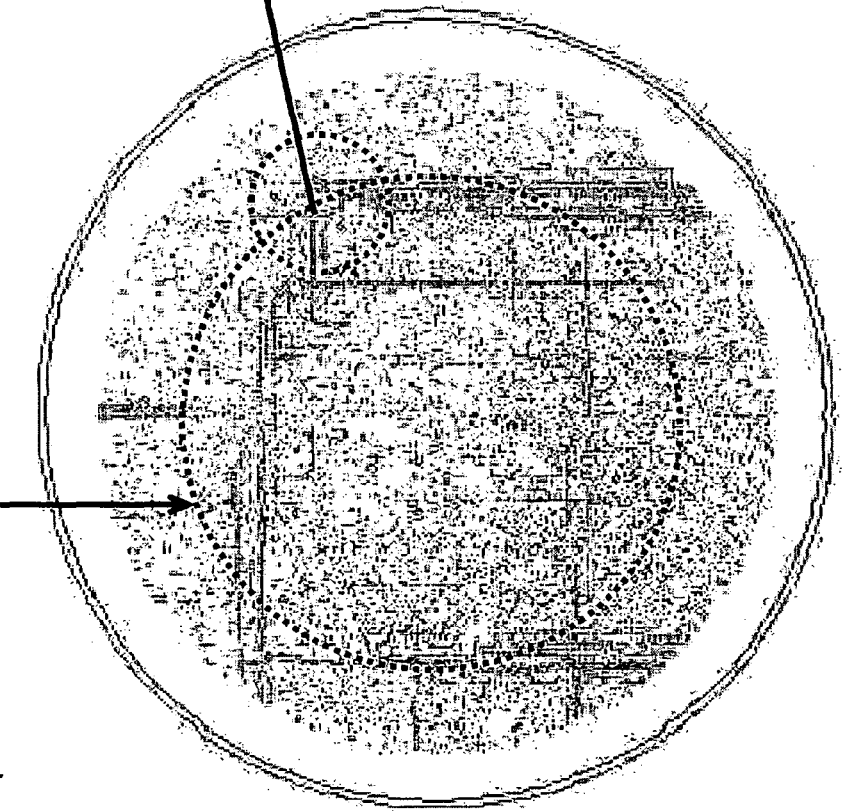

FIG. 12A and FIG. 12B show results from heat treating in the wafer holder support model that is 180 mm in diameter. FIG. 12A is an observation photograph of the entire surface of the wafer by a surface inspection device. FIG. 12B is an optical microscope observation photograph of the wafer rear surface.

The chain line in FIG. 12A and FIG. 12B is a circle with a 180 mm diameter (90 mm radius).

The vertical line and the horizontal line in FIG. 12A and FIG. 12B respectively indicate slips. The point where the vertical line and the horizontal line intersect is the start point for the slips.

In FIG. 12A, a large quantity of slips can be confirmed from a location thought to be the edge of the wafer holder.

In FIG. 12B, a row of damages can be observed along the wafer holder contour, and these damages were confirmed to be the start point for the slips. In this case also, it is thought that the stress caused by deformation due to the wafer's own weight and heat expansion during rises and falls in temperature, concentrates on the wafer support points to form damage that serves as start points to cause slips the same as in the 4-point model.

The diameter of the wafer holder was set from 190 mm to 220 mm, and preferably from 195 mm to 210 mm, for example to 200 mm from the above evaluation results, the surface roughness (arithmetical average roughness) Ra was found as described next, and a heat treating evaluation was made based on surface roughness conditions centering on that surface roughness.

The surface roughness (arithmetically averaged roughness) Ra is found by integrating that surface cross-section function f(x) and dividing by the integration interval. A deriving method is simply shown using the model in FIG. 13.

Figure 13:
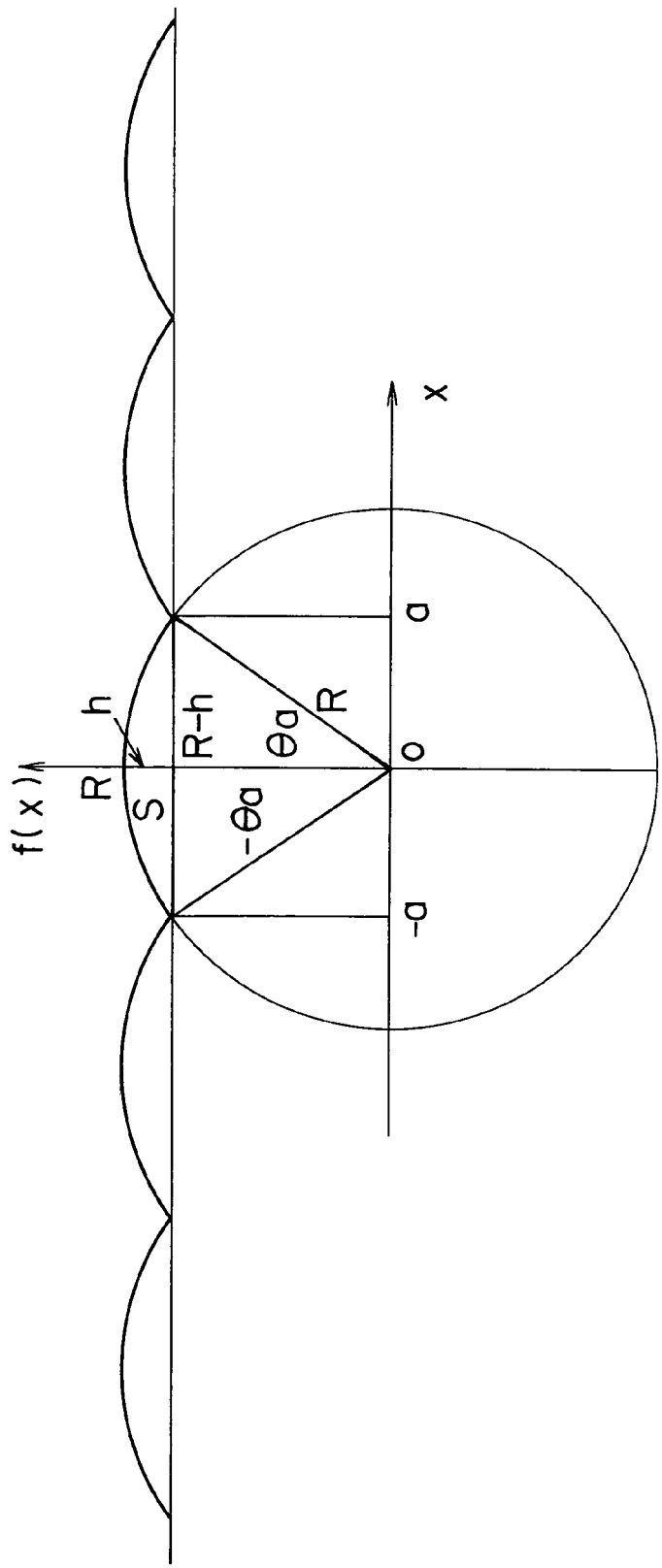
FIG. 13 is a diagram showing a model for finding the surface roughness Ra.

In FIG. 13, setting the section with the continuous arc as the support surface allows expressing that surface roughness Ra with the following formulas.

$$Ra = \frac{1}{2a}\int_{-a}^{a} f(x)dx - 2a(R-h) \qquad (21)$$

The equation (f(x)) for the circle (protrusion cross section) is:

$$f(x) = (R^2 - x^2)^{1/2} \qquad (22)$$

and the surface area S (protrusion cross section area) enclosed by the thick line is as follows:

$$\begin{aligned} S &= \int_{-a}^{a} f(x)dx - 2a(R-h) \qquad (23)\\ &= \int_{-a}^{a} (R^2 - x^2)^{1/2} dx - 2a(R-h)\\ &= R^2\theta a - a(R-h) \end{aligned}$$

Here, $Ra = S/2a$, $$Ra = \{R^2\theta a - a(R-h)\}/2a \qquad (24)$$

so that the surface roughness Ra is expressed as a function of the radius of curvature (R).

Figure 14:
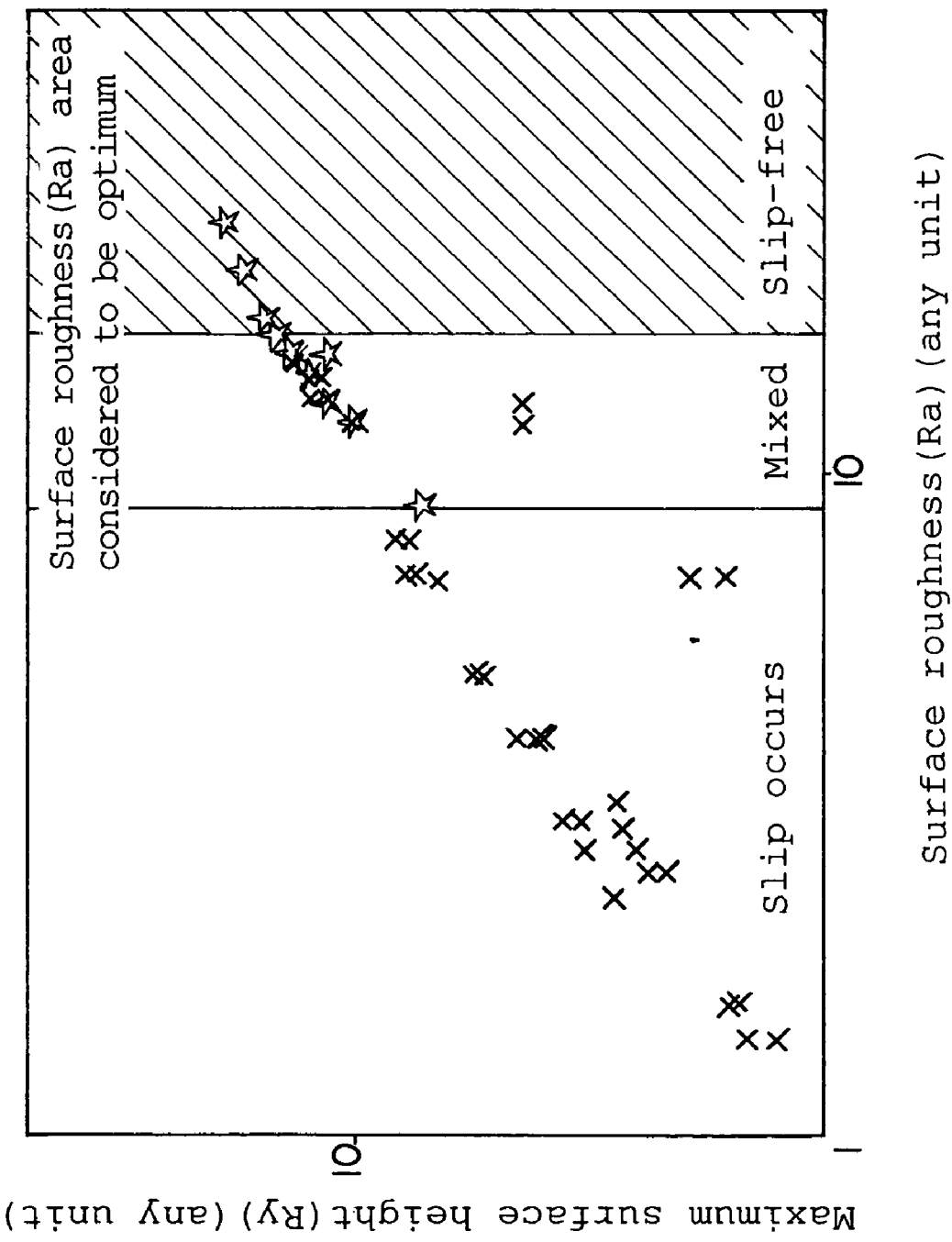
FIG. 14 is a graph showing the interrelation between the surface roughness Ra and the surface maximum height Ry.

FIG. 14 is a graph showing the relation between the maximum surface height Ry and the surface roughness Ra of the wafer holder with a diameter of 200 mm for wafers (x marks in FIG. 14) where slips caused by damage were confirmed, and wafers that were slip-free (☆ marks in FIG. 14).

Slip-free wafers with a diameter of 300 mm were verified in the heat treating process at 1350° C. However, slips were confirmed in the left-side region in FIG. 14 ("Slip-occurs" region). Wafers where slips occurred were also confirmed in the center region in FIG. 14 ("Mixed" region). A stable, slip-free state was confirmed on multiple wafers on the right edge area ("Slip-free" region).

The boundary value between the surface roughness Ra in the slip-occurs region and the surface roughness Ra in the mixed region was approximately 1 μm, and the boundary value between the surface roughness Ra in the mixed region and the surface roughness Ra in the slip-free region was approximately 1.5 μm.

Also, setting the wafer holder surface roughness Ra to a value of 2.0 μm was confirmed to definitely attain a slip-free state.

The adhesive force can here be substituted for the friction force as previously described in FIG. 4 through FIG. 7.

Then, when the radius of curvature of the protrusion which correlates with the surface roughness Ra becomes small, the friction coefficient becomes larger so that the adhesive force increases.

Conversely, when the radius of curvature of the protrusion becomes large, the friction coefficient becomes small so that the adhesive force is reduced.

If the radius of curvature of the protrusion is less than 1 μm when calculating the stress from this friction coefficient, then the total stress exceeds the wafer yield stress so that slips occur. However, it is found that no slips occur if the radius of curvature of the protrusion is 1 μm or more.

However, if the radius of curvature of the protrusion is exactly 1 μm then there is little margin so that slips might possibly occur. Setting the radius of curvature of the protrusion to 1.5 μm makes a much larger margin so that there is a very high probability that slips can be prevented. Setting the radius of curvature of the protrusion to 2 μm further increases the probability that no slips will occur.

On the other hand, achieving a slip-free state is impossible when the upper limit of 1,000 μm of the wafer holder surface roughness Ra has been exceeded, because maintaining that level of machining precision in actual surface processing of the wafer holder is not practical.

Moreover, results identical to those shown in FIG. 14 were confirmed even when the wafer holder diameter was varied between 190 mm to 220 mm.

However, the results obtained in FIG. 14 were not obtained when the wafer holder diameter was set below 180 mm, and when the wafer holder diameter was set to 230 mm or more.

The reasons for these results are as follows.

Whether or not slips will occur on a wafer is not determined just by the surface roughness Ra of the wafer holder portion which contacts the wafer, and is also dependent on the contact surface area of the wafer holder which contacts the wafer (wafer holder diameter) and the wafer support locations on the wafer holder.

For example, during heat treating at a specific temperature (for example, 1350° C.), even when supporting a 300 mm diameter wafer on a wafer holder with the specified surface roughness Ra (for example, 2.0 μm), when the wafer holder diameter or in other words, the contact surface area between the wafer and the wafer holder or the wafer support locations by the wafer holder changes, then in some cases slips will occur, and in some cases slips will not occur on the wafer.

Accordingly, when supporting a wafer on a wafer holder whose diameter is between 190 mm to 220 mm so that the wafer displacement (deflection) will be a minimum, then both slips caused by excessive smoothing the wafer holder and slips caused by damage from protrusions on the wafer holder surface can be prevented by setting the wafer holder surface roughness Ra from 1 μm to 1,000 μm, and preferably 1.5 μm to 1,000 μm, and still more preferably from 2 μm to 1000 μm. However, when the wafer holder diameter is 180 mm or less, and when the wafer holder diameter is 230 mm or more, or in other words, the wafer displacement (deflection) is comparatively large, then at least one of either slips caused by damage from protrusions on the wafer holder surface or slips caused by excessive smoothing the wafer holder will occur even if the wafer holder surface roughness Ra is set from 1 μm to 1,000 μm, and preferably 1.5 μm to 1,000 μm, and still more preferably from 2 μm to 1000 μm.

FIG. 15A and FIG. 15B are views showing the processing results when a wafer holder was used whose surface roughness Ra was in the "Slip-occurs" region. FIG. 15A is an observation photograph made by a surface inspection device. FIG. 15B is a microscope observation photograph of slips from damage as a start point.

Slips concentrated in the vicinity of the wafer center were confirmed.

The reasons for these results are as follows.

A large adhesive force Fa occurs between the wafer and support portion (wafer holder) due to the small surface roughness Ra. Slips occurred as the heat treat progressed in a state where the wafer and the support portion adhered in the vicinity of the wafer center. Proof of the slips appears in FIG. 15B as traces at the rear surface of the wafer showing a section of the support portion or in other words the surface of the wafer holder was peeled away, and slips were further observed due to this impact.

Figure 16B:
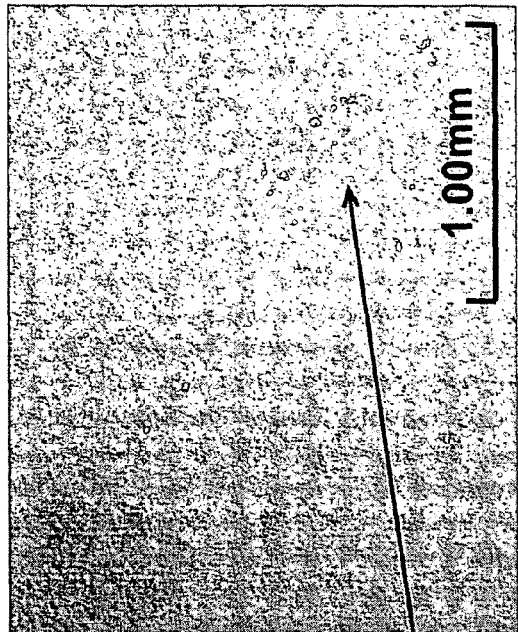
FIG. 16A and FIG. 16B are photographs showing processing results on the wafer whose surface roughness Ra is in "slip-free" region.
Figure 16A:
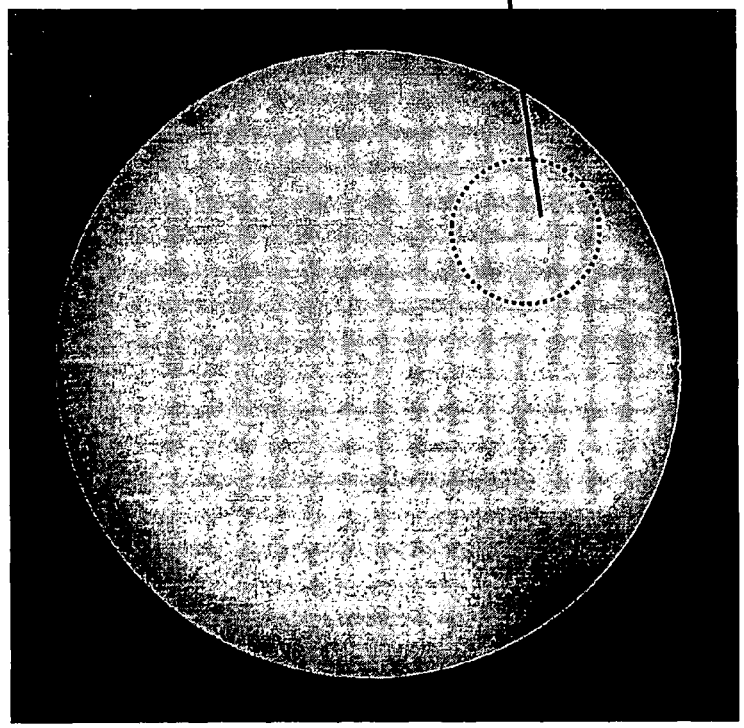

FIG. 16A and FIG. 16 B are views showing the processing results when a wafer holder was used whose surface roughness Ra was in the "Slip-free" region. FIG. 16A is an observation photograph made by X-Ray topograph. FIG. 16B is a microscope observation photograph showing small damages on the wafer holder edge.

No slips at all were observed on the wafer. However, small damage is formed on the circumference on the wafer holder edge as shown in the microscope photographs. No slips could be confirmed from the small damage on the surface inspection device, X-ray topograph and by microscope observation. The small damages were present on the entire surface contacting the wafer holder though they were too small to be verified by X-ray topograph. They could however be observed by microscope, which is proof that the tiny protrusions present for the entire region at the boundary between the wafer and support portion namely, the wafer holder dispersed friction force Ff with a good balance.

The present invention is not limited to the examples in the above embodiments and needless to say, changes of different types not departing from the spirit or the scope of the present invention are permitted.

The wafer holder for example, is not limited to a structure where the surface of the silicon plate is covered with a material harder than silicon, such as silicon carbide film or silicon nitride film, and may be a structure where the silicon plate surface is covered with a material whose hardness is smaller than silicon, such as silicon oxide film, and may also be a structure of silicon carbide plate or a silicon nitride plate.

A least one through-hole may also be formed in the wafer holder. Forming this type of structure allows air between the wafer and wafer holder to pass through the through-holes outside when transferring the wafer to the wafer holder, and can prevent wafer slip on the wafer holder. A wafer holder with this type of structure also can prevent both slips caused by excessive smoothing of the wafer holder, and slips caused by damage from protrusions on the wafer holder surface.

A process for forming an oxidation film on the wafer in an IC manufacturing method was described in the above embodiment. However, the heat treating apparatus of the present invention may also be applied to other heat treating processes in IC manufacturing methods.

The present invention may be preferably applied in particular to heat treating processes performed at comparatively high temperatures such as thermal oxidation processes including dry oxidation, wet oxidation, hydrogen pyrogenic oxidation, and hydrochloric acid (HCl) oxidation; and thermal diffusion processes for diffusing dopants such as boron (B), phosphorus (p), arsenic (As), antimony (Sb) into semiconductor thin film; and annealing processes, etc.

Applying the heat treating apparatus of the present invention to heat treating processes of these types for IC manufacturing methods can prevent wafer slips from occurring.

Moreover, the heat treating apparatus of the present invention exhibits excellent effects when applied to method for manufacturing substrates.

The application of the heat treating apparatus of the present invention for example to heat treating processes in SIMOX (separation by implanted oxygen) wafers which are one type of SOI (silicon on insulator) wafers is described next.

First of all, an ion implantation device, etc. implants oxygen ions into the single crystal silicon wafer. After ion implantation, the oxygen ion implanted wafer is then subjected to annealing at high temperatures of approximately 1300° C. to 1400° C. (for example, 1350° C. or more) in for example an argon (Ar) atmosphere or oxygen ($O_2$) atmosphere by the heat treating apparatus of the present invention. These processes in this way manufacture a SIMOX wafer with a silicon oxide ($SiO_2$) layer formed (with a silicon oxide layer embedded) in the interior of the wafer.

The heat treating apparatus of the present invention can also be applied to heat treating processes in hydrogen annealed wafers manufacturing methods. In this case also, the wafer is annealed at high temperatures of 1200° C. or higher in a hydrogen atmosphere using the heat treating apparatus of the present invention. Crystal flaws in the surface layers of the wafer for manufacturing the IC can in this way be reduced and the crystalline integrity can be enhanced.

The heat treating apparatus of the present invention can also be applied to heat treating processes for epitaxial wafer manufacturing methods.

Utilizing the heat treating apparatus of the present invention can prevent the occurrence of wafer slips even in cases where annealing at high temperatures in the above described process for manufacturing substrates is performed.

The present invention is not limited to dry oxidizing devices and may also be applied to other general types of the heat treating apparatus including oxidizing devices, diffusion devices, annealing devices as well as other treating devices, etc.

In the above embodiment, the case where silicon wafers were processed was described, however the substrate for processing may also include germanium wafers and compound semiconductor wafers, etc. Moreover, the present invention may also be applied to photo masking and printed circuit boards, liquid crystal panels, compact disks and magnetic disks, etc.

The invention claimed is:

1. A heat treating apparatus comprising a processing chamber for heat treating a substrate, and a support tool for supporting the substrate in the processing chamber; and the support tool having a support plate which contacts the substrate, and a main body for supporting the support plate, wherein the diameter of the support plate is 63 to 73 percent of the diameter of the substrate and the surface roughness Ra of at least a portion of the support plate which contacts the substrate is set from 1 μm to 1,000 μm.

2. The heat treating apparatus according to claim 1, wherein the surface roughness Ra of at least the portion of the support plate which contacts the substrate is set from 1.5 μm to 1,000 μm.

3. The heat treating apparatus according to claim 1, wherein the surface roughness Ra of at least the portion of the support plate which contacts the substrate is set from 2 μm to 1,000 μm.

4. The heat treating apparatus according to claim 1, wherein the diameter of the substrate is 300 mm, and the diameter of the support plate is 190 mm to 220 mm.

5. The heat treating apparatus according to claim 1, wherein the hardness of at least the portion of the support plate which contacts the substrate is the same as or greater than the hardness of the substrate.

6. The heat treating apparatus according to claim 1, wherein the main body is made from silicon carbide, and the support plate is made from silicon or silicon carbide.

7. The heat treating apparatus according to claim 1, wherein a layer of silicon oxide, silicon carbide, or silicon nitride is formed on the surface of the support plate.

8. The heat treating apparatus according to claim 1, wherein the heat treatment is performed at a temperature of 1300° or higher.

9. The heat treating apparatus according to claim 1, wherein at least one through hole is formed in the support plate.

10. A method for manufacturing a substrate comprising the steps of:

supporting a substrate on a support plate in which the diameter is 63 to 73 percent of the substrate diameter, and the surface roughness Ra of at least the portion which contacts the substrate is 1 μm to 1,000 μm;

loading the substrate supported on the support plate into a processing chamber;

heat treating the substrate supported on the support plate in the processing chamber; and unloading the substrate from the processing chamber after the heat treating.

11. A support tool for supporting a substrate when the substrate is heat treated, wherein the support tool has a support plate which contacts the substrate, and a main body for supporting the support plate, the diameter of the support plate is 63 to 73 percent of the diameter of the substrate and the surface roughness Ra of at least a portion of the support plate which contacts the substrate is set from 1 μm to 1,000 μm.

12. The support tool according to claim 11, wherein the surface roughness Ra of at least the portion of the support plate which contacts the substrate is set from 1.5 μm to 1,000 μm.

13. The support tool according to claim 11, wherein the surface roughness Ra of at least the portion of the support plate which contacts the substrate is set from 2 μm to 1,000 μm.

14. The support tool according to claim 11, wherein the diameter of the substrate is 300 mm, and the diameter of the support plate is 190 mm to 220 mm.

15. The support tool according to claim 11, wherein the main body is made of silicon carbide, and the support plate is made from silicon or silicon carbide.

16. The support tool according to claim 11, wherein a layer of silicon oxide, silicon carbide, or silicon nitride is formed on the surface of the support plate.

17. The support tool according to claim 11, wherein at least one through hole is formed in the support plate.

18. A support plate for supporting a substrate when the substrate is heat treated, wherein the diameter of the support plate is 63 to 73 percent of the diameter of the substrate and the surface roughness Ra of at least a portion of the support plate which contacts the substrate is set from 1 μm to 1,000 μm.

19. The support plate according to claim 18, wherein the surface roughness Ra of at least the portion of the support plate which contacts the substrate is set from 1.5 μm to 1,000 μm.

20. The support plate according to claim 18, wherein the surface roughness Ra of at least the portion of the support plate which contacts the substrate is set from 2 μm to 1,000 μm.

21. The support plate according to claim 18, wherein the diameter of the substrate is 300 mm, and the diameter of the support plate is 190 mm to 220 mm.

22. The support plate according to claim 18, wherein the support plate is made from silicon or silicon carbide.

23. The support plate according to claim 18, wherein a layer of silicon oxide, silicon carbide, or silicon nitride is formed on the surface of the support plate.

24. The support plate according to claim 18, wherein at least one through hole is formed in the support plate.

* * * * *